(12) United States Patent
Gao

(10) Patent No.: US 11,816,361 B2
(45) Date of Patent: Nov. 14, 2023

(54) CIRCUIT AND METHOD FOR TRANSMITTING DATA TO MEMORY ARRAY, AND STORAGE APPARATUS

(71) Applicant: CHANGXIN MEMORY TECHNOLOGIES, INC., Hefei (CN)

(72) Inventor: Enpeng Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/807,358

(22) Filed: Jun. 16, 2022

(65) Prior Publication Data

US 2023/0315339 A1 Oct. 5, 2023

Related U.S. Application Data

(63) Continuation of application No. PCT/CN2022/097377, filed on Jun. 7, 2022.

(30) Foreign Application Priority Data

Apr. 2, 2022 (CN) .......................... 202210344138.8

(51) Int. Cl.
*G06F 3/06* (2006.01)
*G11C 11/4096* (2006.01)

(52) U.S. Cl.
CPC ............ *G06F 3/0659* (2013.01); *G06F 3/061* (2013.01); *G06F 3/0673* (2013.01); *G11C 11/4096* (2013.01)

(58) Field of Classification Search
CPC ...... G06F 3/0659; G06F 3/061; G06F 3/0673; G06F 3/0604; G06F 3/0656;
(Continued)

(56) References Cited

U.S. PATENT DOCUMENTS

| 4,649,537 A | 3/1987 | Rosswurm et al. |
| 5,790,564 A | 8/1998 | Adams et al. |

(Continued)

FOREIGN PATENT DOCUMENTS

| CN | 101504600 A | 8/2009 |
| CN | 101840383 A | 9/2010 |

(Continued)

OTHER PUBLICATIONS

China International Search Report and written opinion in Application No. PCT/CN2022/097377, dated Dec. 21, 2022.

(Continued)

*Primary Examiner* — Rocio Del Mar Perez-Velez
*Assistant Examiner* — Tong B. Vo
(74) *Attorney, Agent, or Firm* — SYNCODA LLC; Feng Ma

(57) ABSTRACT

A circuit for transmitting data includes a mode register data processing module, an external data transmission module, and an internal data transmission module provided in a memory array; the mode register data processing module is configured to write initial data into a reserved mode register in a mode register in response to a write enable command; and the external data transmission module is electrically connected to both the reserved mode register and the internal data transmission module, and is configured to write, in response to an enable signal, target data into the memory array via the internal data transmission module according to the initial data and a preset encoding rule, wherein a number of bytes of the target data is greater than a number of bytes of the initial data.

16 Claims, 18 Drawing Sheets

(58) Field of Classification Search
CPC .... G06F 3/0611; G06F 3/0653; G06F 3/0631; G06F 3/0608; G06F 3/0683; G06F 3/0644; G11C 11/4096; G11C 11/4076; G11C 7/22; G11C 16/10; G11C 16/26
See application file for complete search history.

(56) References Cited

U.S. PATENT DOCUMENTS

| | | | | |
|---|---|---|---|---|
| 6,636,998 | B1* | 10/2003 | Lee | G11C 29/12 |
| | | | | 365/201 |
| 9,905,288 | B2 | 2/2018 | Ryu et al. | |
| 2003/0033567 | A1* | 2/2003 | Tamura | G06F 11/1068 |
| | | | | 714/763 |
| 2006/0107156 | A1 | 5/2006 | Lee et al. | |
| 2006/0163572 | A1* | 7/2006 | Jeong | G11C 29/14 |
| | | | | 257/48 |
| 2015/0187440 | A1 | 7/2015 | Hollis | |
| 2016/0284390 | A1* | 9/2016 | Tomishima | G11C 11/4091 |
| 2018/0130506 | A1* | 5/2018 | Kang | G11C 7/22 |
| 2019/0146869 | A1* | 5/2019 | Howe | G06F 11/1068 |
| | | | | 714/764 |
| 2019/0188165 | A1 | 6/2019 | Venkatraman et al. | |
| 2022/0244863 | A1* | 8/2022 | Bhatia | G06F 3/0619 |
| 2022/0269419 | A1* | 8/2022 | Kim | G11C 29/028 |

FOREIGN PATENT DOCUMENTS

| | | |
|---|---|---|
| CN | 108121672 A | 6/2018 |
| CN | 110865909 A | 3/2020 |
| CN | 111427805 A | 7/2020 |
| CN | 113553277 A | 10/2021 |
| KR | 20050107291 A | 11/2005 |

OTHER PUBLICATIONS

China International Search Report and written opinion in Application No. PCT/CN2022/095119, dated Nov. 28, 2022.

U.S. Appl. No. 17/806,003 non-final office action, dated Apr. 24, 2023.

* cited by examiner

CIRCUIT AND METHOD FOR TRANSMITTING DATA TO MEMORY ARRAY, AND STORAGE APPARATUS

CROSS-REFERENCE TO RELATED APPLICATIONS

This is a continuation of International Application No. PCT/CN2022/097377 filed on Jun. 7, 2022, which claims priority to Chinese Patent Application No. 202210344138.8 filed on Apr. 2, 2022. The disclosures of these applications are hereby incorporated by reference in their entirety.

BACKGROUND

With the rapid development of the semiconductor technology, the market has put forward higher requirements on the storage capacity and performance of semiconductor storage apparatuses. The increase in storage capacity of semiconductor storage apparatuses leads to an increase in the number of memory cells per unit area, causing an increase in the power consumption per unit area of semiconductor storage apparatuses.

The method of writing data to semiconductor storage apparatuses by using a data strobe clock signal cannot meet the market demand on the storage performance of semiconductor storage apparatuses and may increase the power consumption of the semiconductor storage apparatuses.

SUMMARY

The present disclosure relates to, but is not limited to, a circuit and a method for transmitting data, and a storage apparatus.

An overview of the subject matter detailed in the present disclosure is provided below, which is not intended to limit the protection scope of the claims.

The present disclosure provides a circuit and a method for transmitting data, and a storage apparatus.

A first aspect of the present disclosure provides a circuit for transmitting data, including a mode register data processing module, an external data transmission module, and an internal data transmission module provided in a memory array; the mode register data processing module is configured to write initial data into a reserved mode register in a mode register in response to a mode register write enable command; and the external data transmission module is electrically connected to both the reserved mode register and the internal data transmission module, and is configured to write, in response to an enable signal, target data into the memory array via the internal data transmission module according to the initial data and a preset encoding rule, wherein a number of bytes of the target data is greater than a number of bytes of the initial data.

A second aspect of the present disclosure provides a storage apparatus, including: a memory array, a mode register, and the circuit for transmitting data according to the first aspect.

A third aspect of the present disclosure provides a method for transmitting data, including: controlling a mode register data processing module to write initial data into a reserved mode register in a mode register in response to a mode register write enable command; and controlling an external data transmission module to write, in response to an enable signal, target data into a memory array via an internal data transmission module according to the initial data and a preset encoding rule, wherein a number of bytes of the target data is greater than a number of bytes of the initial data.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

Figure 1:
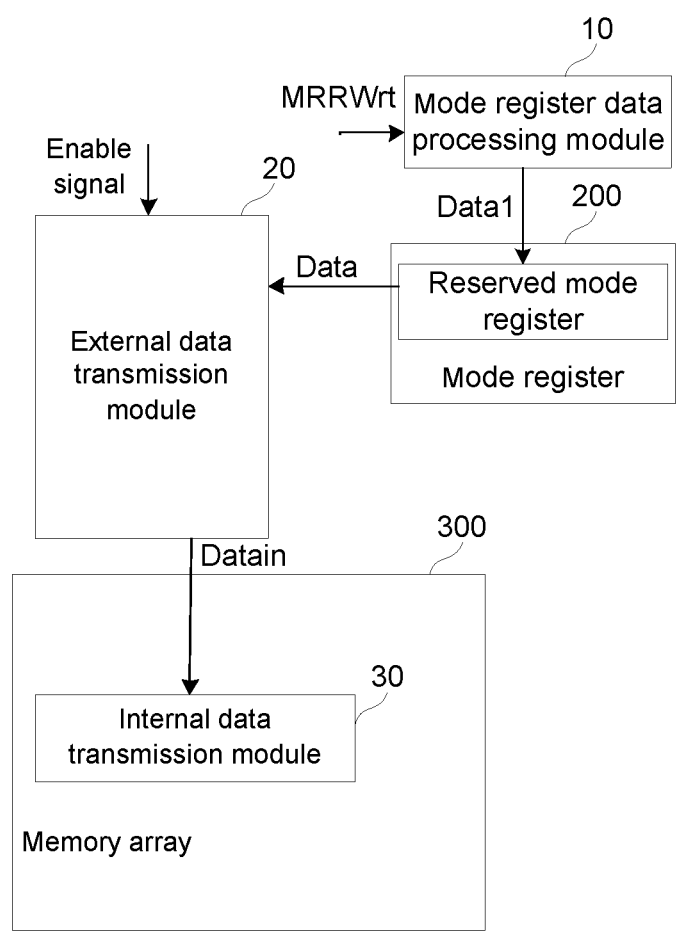
FIG. 1 is a schematic circuit principle diagram of a circuit for transmitting data according to a first embodiment of the present disclosure.

Reference numerals:
10: mode register data processing module; 20: external data transmission module; 21: preset data transmission module; 22: first data transmission module; 23: second data transmission module; 24: general data transmission module; 241: first general data transmission module; 242: second general data transmission module; 30: internal data transmission module; 200: mode register; 300: memory array; 211: $1^{st}$ preset data transmission unit; 21K: $K^{th}$ preset data transmission unit; 21 N2: $N2^{th}$ preset data transmission unit; 31: $1^{st}$ internal data transmission unit; 3$m$: $m^{th}$ internal data transmission unit; 3N2: $N2^{th}$ internal data transmission unit.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In a low power double data rate SDRAM (LPDDR5), a control command informs positioning information of a monitor mode register command MR21, a Write X command is executed after the monitor mode register command MR21 is determined to meet a condition, then a column address strobe (CAS) command is received, and corresponding data in a specified column address is determined to be written 1 or 0 based on the high or low values of the WXSA (which determines the low 8-bit data) and WXSB (which determines the high 8-bit data) bits of WRX in the CAS command. With this function, a large amount of duplicate data, such as all "0" or all "1", can be written into the memory array. However, CAS_Write X does not work for writing other preset data to the memory array.

The embodiments of the present disclosure are intended to write arbitrary data to the memory array while ensuring the storage capacity of the semiconductor storage apparatus, improving the storage performance and reducing the data transmission power consumption of the semiconductor storage apparatus.

Referring to FIG. 1, an embodiment of the present disclosure provides a circuit for transmitting data, including a mode register data processing module 10, an external data transmission module 20, and an internal data transmission module 30 provided in a memory array 300. The mode register data processing module 10 is configured to write initial data Data into a reserved mode register in a mode register 200 in response to a mode register write enable command MRRWrt; and the external data transmission module 20 is electrically connected to both the reserved mode register and the internal data transmission module 30, and is configured to write, in response to an enable signal, target data Datain into the memory array 300 via the internal data transmission module 30 according to the initial data Data and a preset encoding rule, where the number of bytes of the target data Datain is greater than the number of bytes of the initial data Data. There are 128 mode registers of 8-bit width defined in LPDDR5, some of which are not effectively utilized and are generally used as reserved mode registers. Since the target data Datain is written into the memory array 300 by using the reserved mode registers in the mode register 200 and the conventional mode register write enable command MRRWrt, and the content of the target data Datain can be changed by setting different encoding rules, such that arbitrary data can be written into the memory array 300 without a data strobe clock signal (WCK) or a data clock signal (DQ) and without increasing structure complexity of the circuit, thus effectively improving the storage performance of the semiconductor storage apparatus. Because of the low-power-consumption write function of the enable signal, this embodiment reduces the data transmission power consumption of the semiconductor storage apparatus while ensuring the storage capacity.

Figure 2:
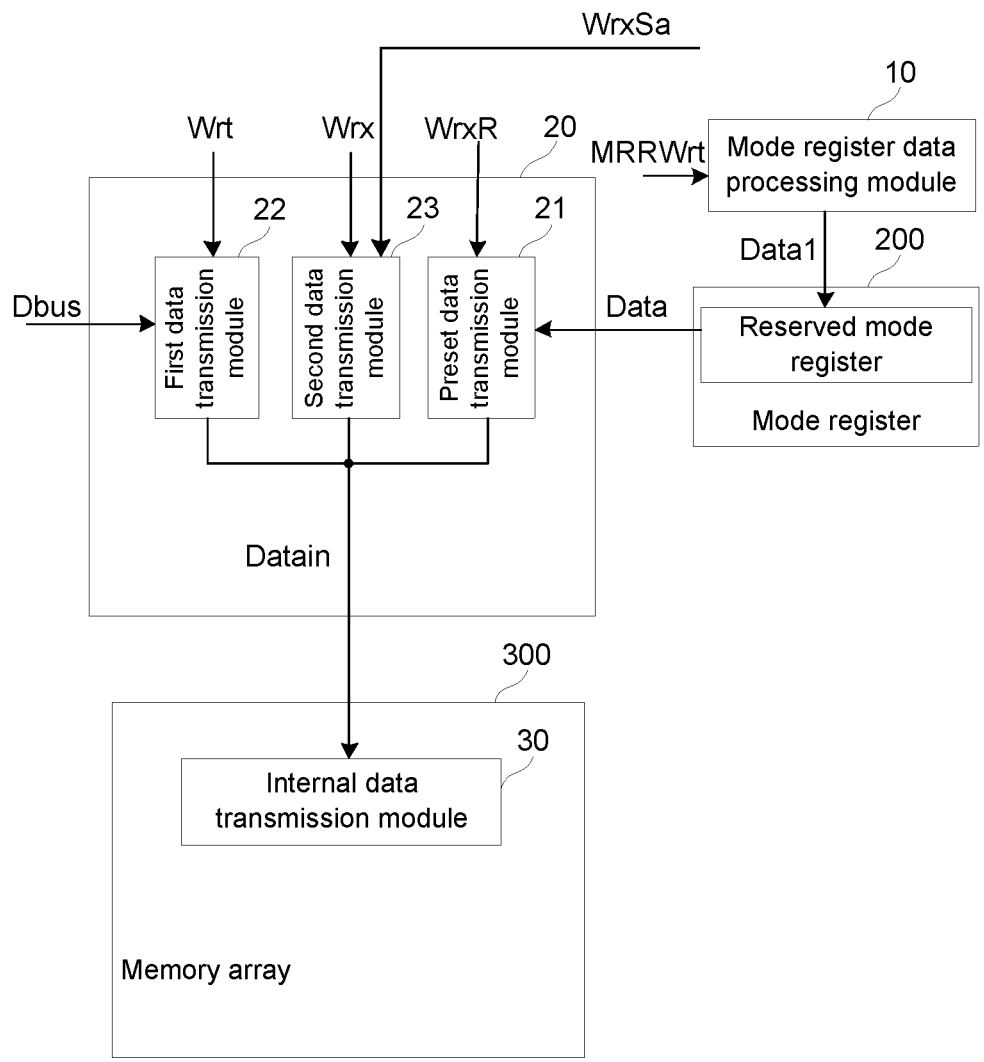
FIG. 2 is a schematic circuit principle diagram of a circuit for transmitting data according to a second embodiment of the present disclosure.

In some exemplary embodiments, referring to FIG. 2, the number of bytes of the initial data is N1, the number of bytes of the target data is N2, the external data transmission module 20 includes a preset data transmission module 21, and the preset data transmission module 21 includes N2 preset data transmission units; each bit of data of the initial data is electrically connected to an input terminal of the internal data transmission module via corresponding N3 preset data transmission units; N3=N2/N1; and N1, N2 and N3 are all positive integers. The embodiments reduce the complexity of writing the target data into the memory array 300 based on the initial data.

In some exemplary embodiments, the preset data transmission module may be disposed inside or outside of the memory array. The embodiments of the present disclosure are intended to exemplarily illustrate the implementation principles and do not specifically limit the specific location of the preset data transmission module.

In some exemplary embodiments, still referring to FIG. 2, the enable signal further includes a write enable signal Wrt, the external data transmission module 20 further includes a first data transmission module 22, the first data transmission module 22 includes first data transmission units, and the number of the first data transmission units is equal to the number of bytes, for example, N2, of the target data Datain; an input terminal of the first data transmission unit is electrically connected to a corresponding data bus Dbus, an output terminal of the first data transmission unit is electrically connected to the internal data transmission module 30, and a control terminal of the first data transmission unit is configured to receive the write enable signal Wrt and provide, in response to the write enable signal Wrt, corresponding data to the internal data transmission module 30 based on the data provided by the corresponding data bus Dbus. In the embodiments, the first data transmission module 22 transmits the data provided by the data bus Dbus in response to the write enable signal Wrt, to write data into the memory array with low power consumption, thereby meeting the storage data writing needs of different application scenarios.

In some exemplary embodiments, still referring to FIG. 2, the enable signal further includes a low-power-consumption write enable signal Wrx; the external data transmission module 20 further includes a second data transmission module 23, the second data transmission module 23 includes second data transmission units, and the number of the second data transmission units is equal to the number of bytes, for example, N2, of the target data Datain; an input terminal of the second data transmission unit is connected to a corresponding low-power-consumption data line WrxSa, an output terminal of the second data transmission unit is electrically connected to the internal data transmission module 30, and a control terminal is configured to receive the low-power-consumption write enable signal Wrx and provide, in response to the low-power-consumption write enable signal Wrx, corresponding data to the internal data transmission module 30 based on the data provided by the corresponding low-power-consumption data line WrxSa. The low-power-consumption data line WrxSa may be electrically connected to a data pad of the memory via another functional component, to receive data outside the memory via the data pad, or the low-power-consumption data line WrxSa may be electrically connected to the mode register, to receive data provided by the mode register. In this way, in a specific application scenario, the second data transmission module 23 transmits, in response to the low-power-consumption write enable signal Wrx, the data provided by the low-power-consumption data line WrxSa.

Figure 3:
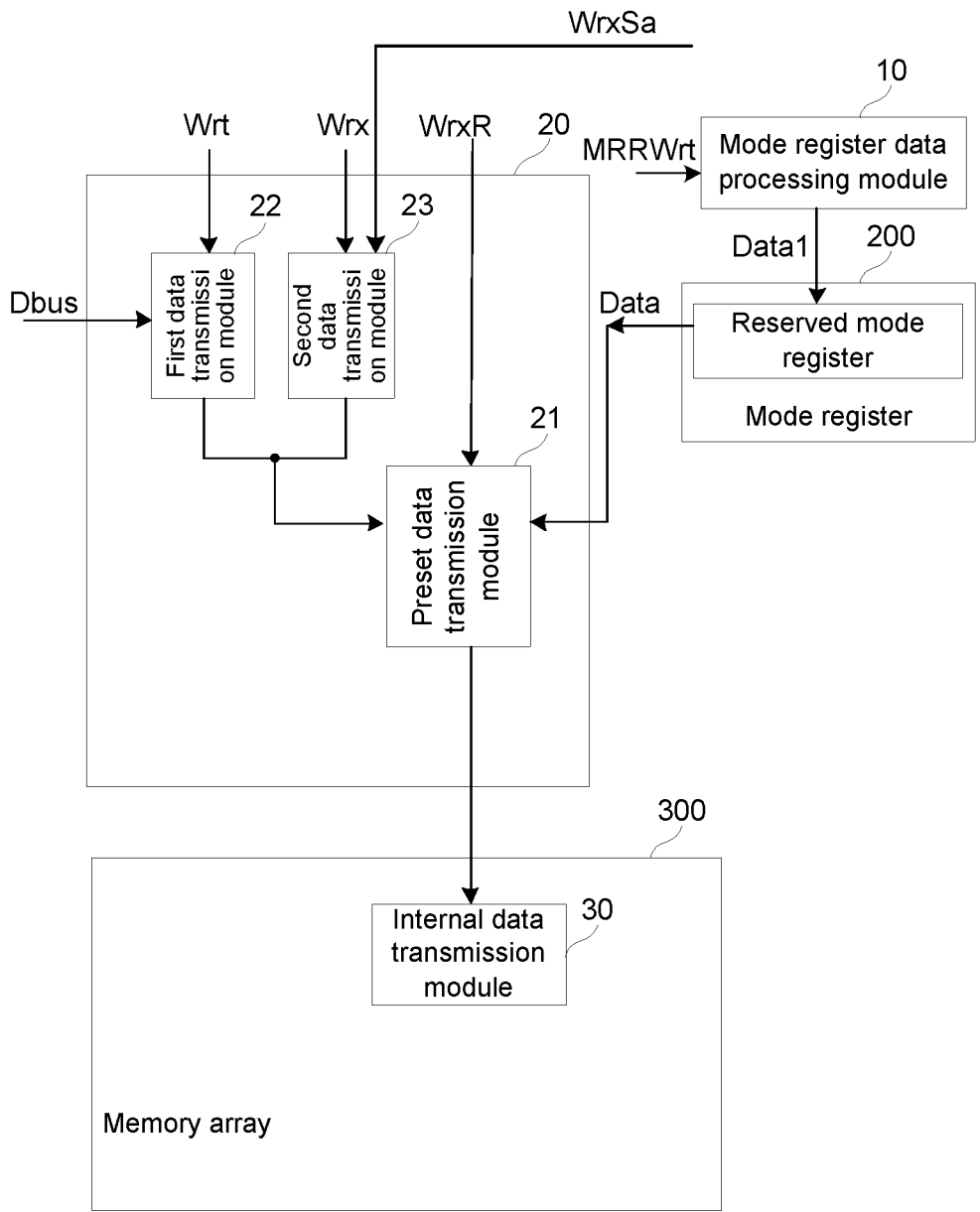
FIG. 3 is a schematic circuit principle diagram of a circuit for transmitting data according to a third embodiment of the present disclosure.

In some exemplary embodiments, referring to FIG. 3, the enable signal further includes a write enable signal Wrt, the external data transmission module 20 further includes a first data transmission module 22, the first data transmission module 22 includes first data transmission units, and the number of the first data transmission units is equal to the number of bytes, for example, N2, of the target data Datain; an input terminal of the first data transmission unit is electrically connected to a corresponding data bus Dbus, an output terminal of the first data transmission unit is electrically connected to the internal data transmission module 30 via the preset data transmission module 21, and a control terminal of the first data transmission unit is configured to receive the write enable signal Wrt and provide, in response to the write enable signal Wrt, corresponding data to the internal data transmission module 30 based on the data provided by the corresponding data bus Dbus. In the embodiments, the first data transmission module 22 transmits the data provided by the data bus Dbus in response to the write enable signal Wrt, to write data into the memory array with low power consumption, thereby meeting the storage data writing needs of different application scenarios.

In some exemplary embodiments, still referring to FIG. 3, the enable signal further includes a low-power-consumption write enable signal Wrx; the external data transmission module 20 further includes a second data transmission module 23, the second data transmission module 23 includes second data transmission units, and the number of the second data transmission units is equal to the number of bytes, for example, N2, of the target data Datain; an input terminal of the second data transmission unit is connected to a corresponding low-power-consumption data line WrxSa, an output terminal of the second data transmission unit is electrically connected to the internal data transmission module 30 via the preset data transmission module 21, and a control terminal is configured to receive the low-power-consumption write enable signal Wrx and provide, in response to the low-power-consumption write enable signal Wrx, corresponding data to the internal data transmission module 30 based on the data provided by the corresponding low-power-consumption data line WrxSa. The low-power-consumption data line WrxSa may be electrically connected to a data pad of the memory via another functional component, to receive data outside the memory via the data pad, or the low-power-consumption data line WrxSa may be electrically connected to the mode register, to receive data provided by the mode register. In this way, in a specific application scenario, the second data transmission module 23 transmits, in response to the low-power-consumption write enable signal Wrx, the data provided by the low-power-consumption data line WrxSa.

Figure 4:
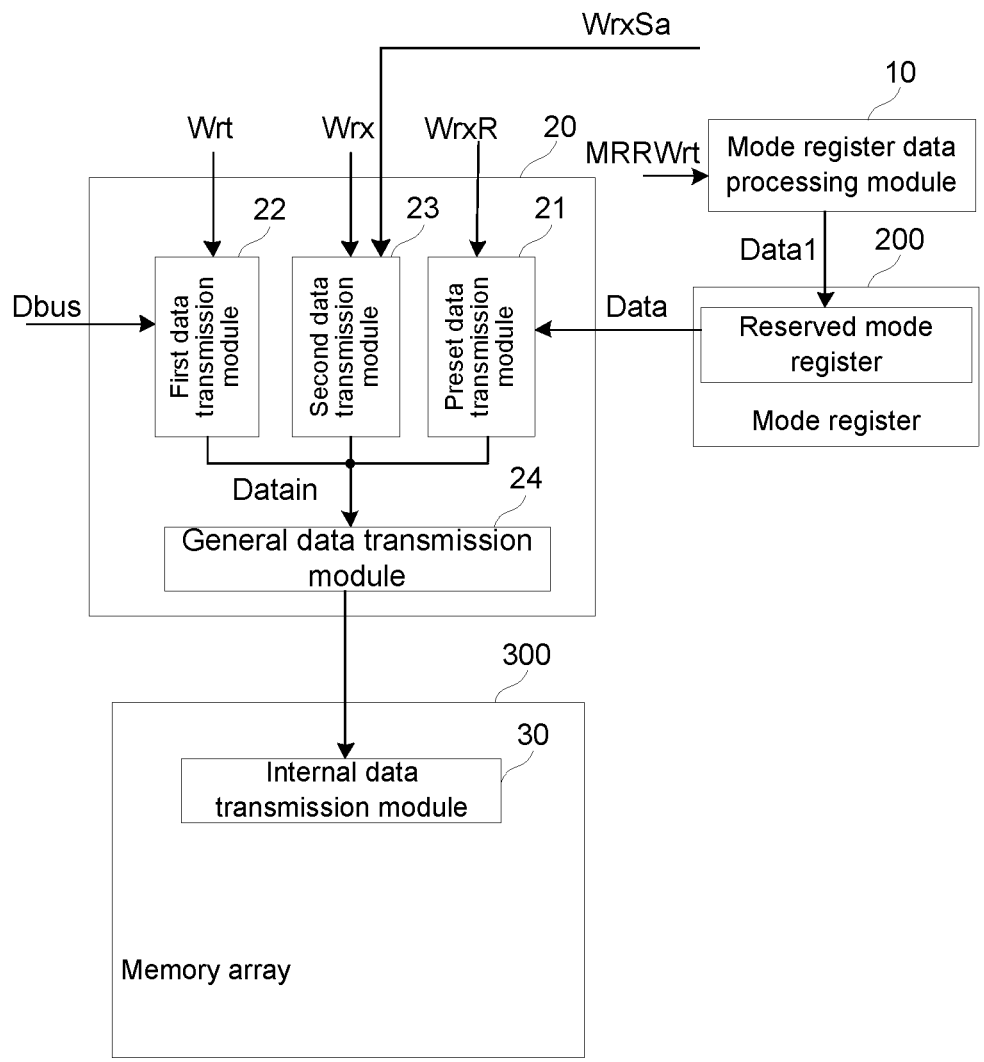
FIG. 4 is a schematic circuit principle diagram of a circuit for transmitting data according to a fourth embodiment of the present disclosure.

In some exemplary embodiments, referring to FIG. 4, the enable signal further includes a write enable signal Wrt, the external data transmission module 20 further includes a first data transmission module 22, the first data transmission module 22 includes first data transmission units, and the number of the first data transmission units is equal to the number of bytes, for example, N2, of the target data Datain; an input terminal of the first data transmission unit is electrically connected to a corresponding data bus Dbus, an output terminal of the first data transmission unit is electrically connected to the internal data transmission module 30 via a general data transmission module 24, and a control terminal of the first data transmission unit is configured to receive the write enable signal Wrt and provide, in response to the write enable signal Wrt, corresponding data to the internal data transmission module 30 based on the data provided by the corresponding data bus Dbus. In the embodiments, the first data transmission module 22 transmits the data provided by the data bus Dbus in response to the write enable signal Wrt, to write data into the memory array with low power consumption, thereby meeting the storage data writing needs of different application scenarios.

In some exemplary embodiments, still referring to FIG. 4, the enable signal further includes a low-power-consumption write enable signal Wrx; the external data transmission module 20 further includes a second data transmission module 23, the second data transmission module 23 includes second data transmission units, and the number of the second data transmission units is equal to the number of bytes, for example, N2, of the target data; an input terminal of the second data transmission unit is connected to a corresponding low-power-consumption data line WrxSa, an output terminal of the second data transmission unit is electrically connected to the internal data transmission module 30 via the general data transmission module 24, and a control terminal is configured to receive the low-power-consumption write enable signal Wrx and provide, in response to the low-power-consumption write enable signal Wrx, corresponding data to the internal data transmission module 30 based on the data provided by the corresponding low-power-consumption data line WrxSa. The low-power-consumption data line WrxSa may be electrically connected to a data pad of the memory via another functional component, to receive data outside the memory via the data pad, or the low-power-consumption data line WrxSa may be electrically connected to the mode register, to receive data provided by the mode register. In this way, in a specific application scenario, the second data transmission module 23 transmits, in response to the low-power-consumption write enable signal Wrx, the data provided by the low-power-consumption data line WrxSa.

Figure 5:
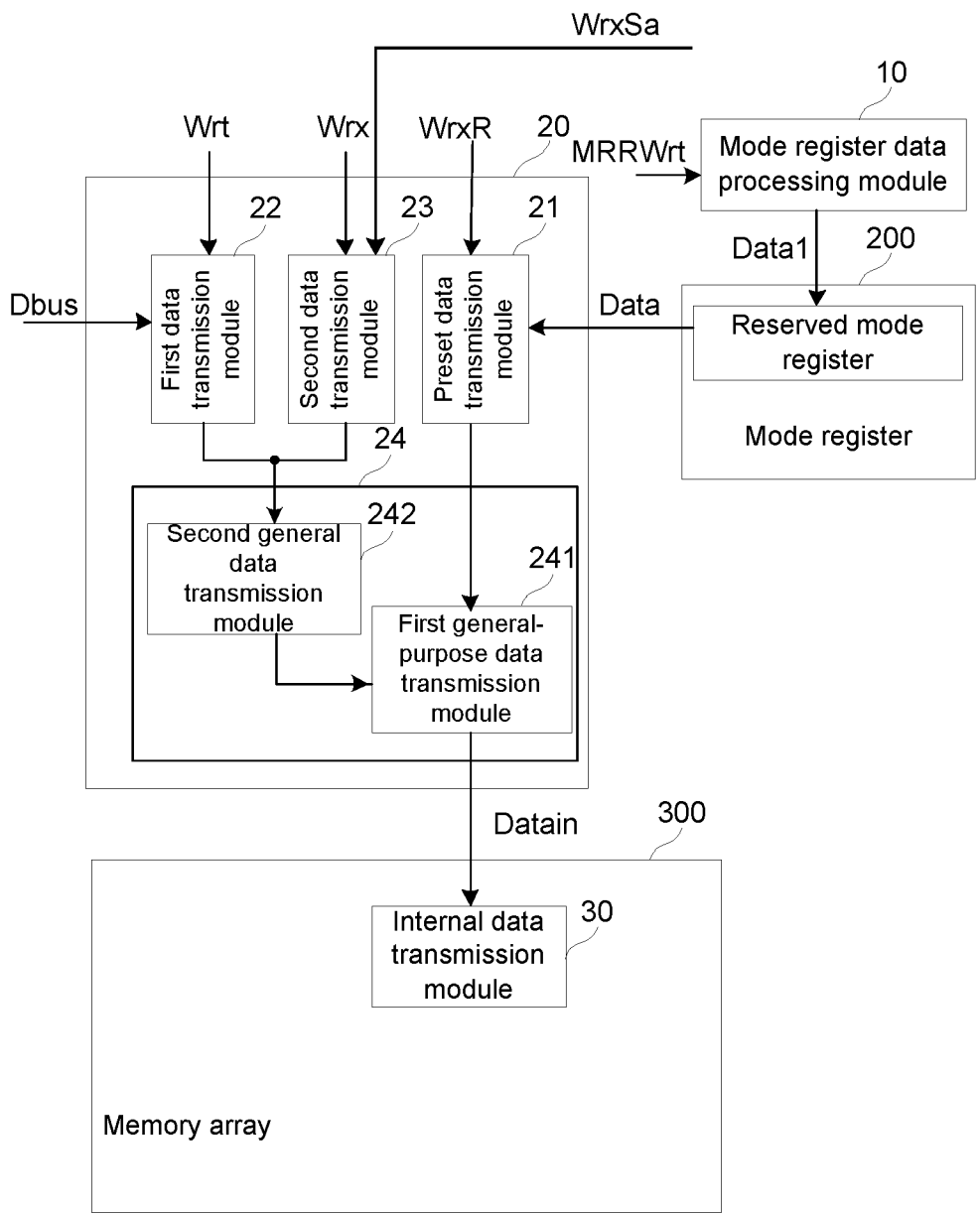
FIG. 5 is a schematic circuit principle diagram of a circuit for transmitting data according to a fifth embodiment of the present disclosure.

In some exemplary embodiments, referring to FIG. 5, the general data transmission module 24 includes a first general data transmission module 241 and a second general data transmission module 242, where a first input terminal of the first general data transmission module 241 is connected to an output terminal of the preset data transmission module 21, and an output terminal of the first general data transmission module 241 is connected to the input terminal of the internal data transmission module 30; and a first input terminal of the second general data transmission module 242 is connected to an output terminal of the first data transmission module 22, a second input terminal of the second general data transmission module 242 is connected to an output terminal of the second data transmission module 23, and an output terminal of the second general data transmission module 242 is connected to a second input terminal of the first general data transmission module 241. The embodiments achieve writing arbitrary target data into the memory array with the help of existing functional components in the specific used circuit, reducing the circuit costs while applicable to the practical needs of many different application scenarios.

Figure 6A:
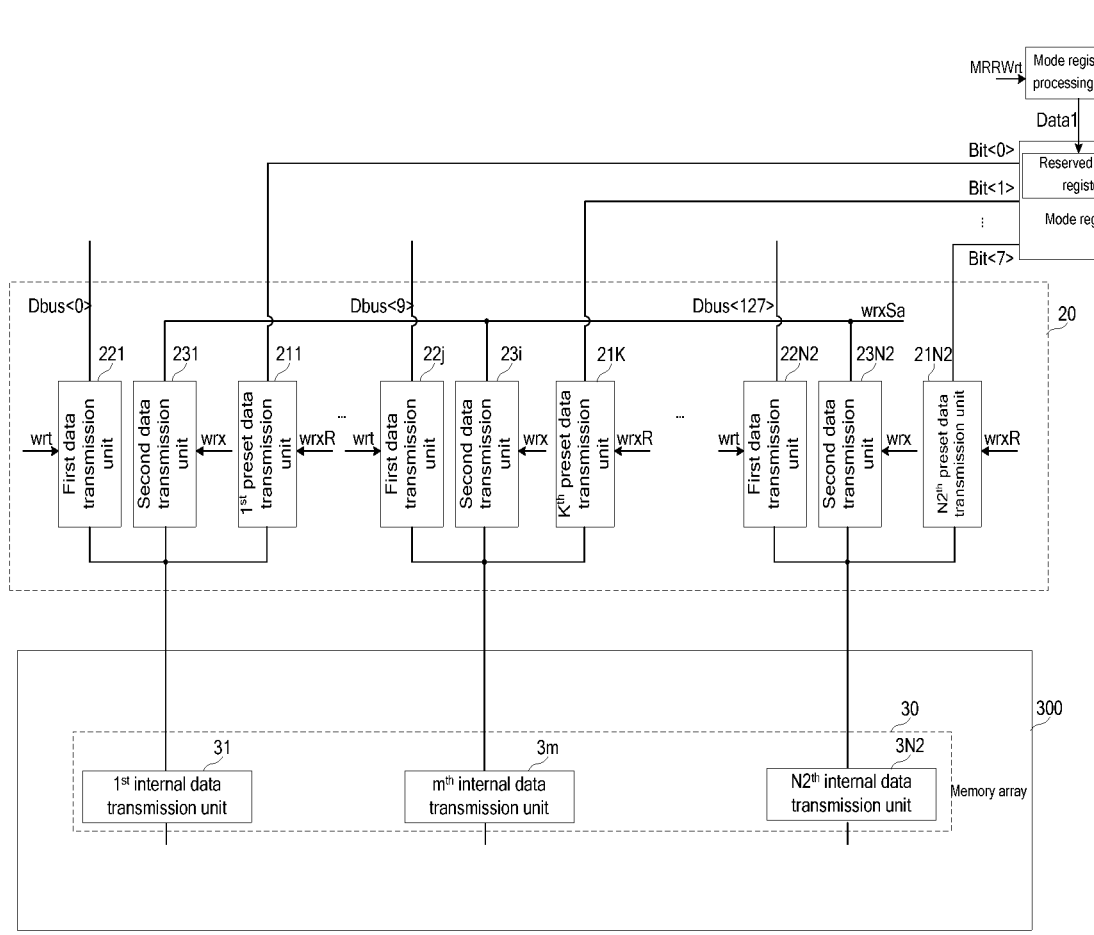
FIG. 6A is a first schematic circuit principle diagram of the embodiment in FIG. 2.
Figure 6B:
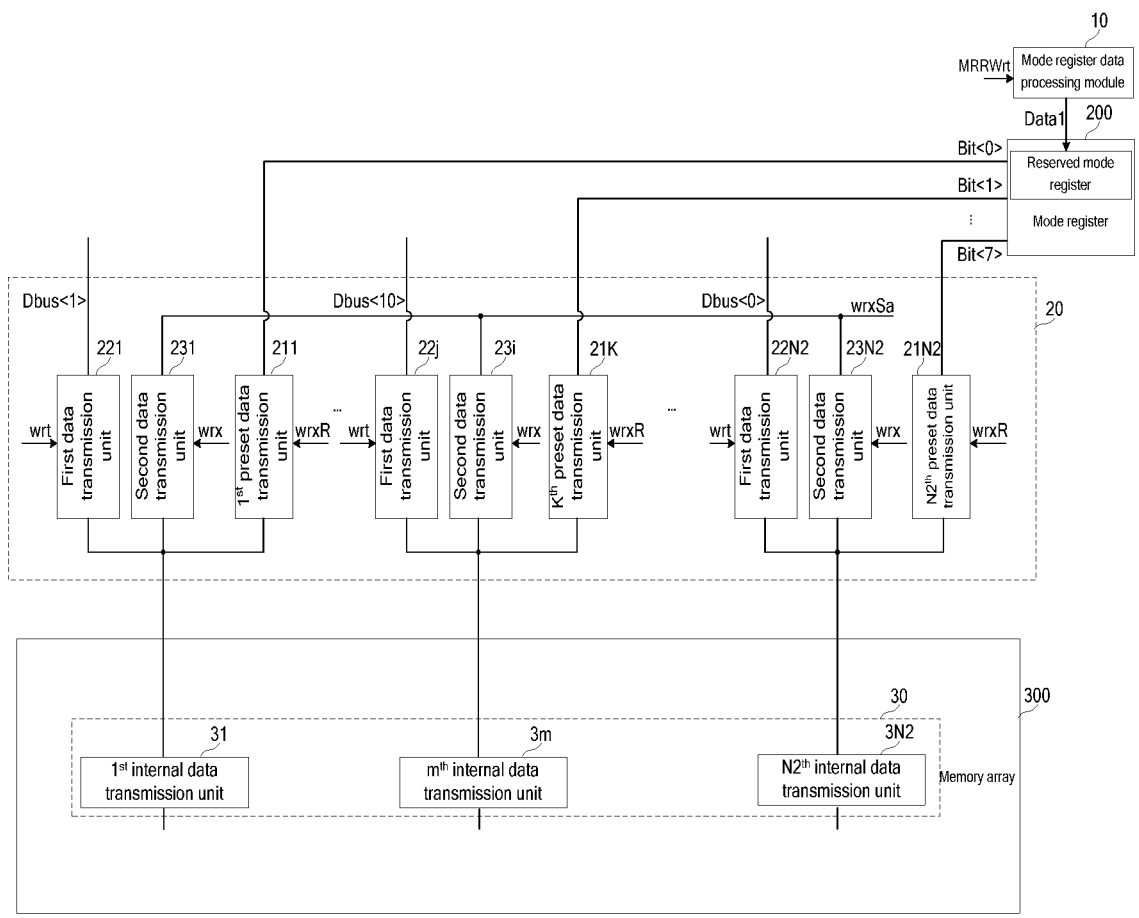
FIG. 6B is a second schematic circuit principle diagram of the embodiment in FIG. 2.

In some exemplary embodiments, referring to FIG. 6A and FIG. 6B, the number of bytes of the initial data Data1 is N1; the number of bytes of the target data is N2; the external data transmission module 20 includes a total of N2 preset data transmission units: a $1^{st}$ preset data transmission unit 211, . . . , a $K^{th}$ preset data transmission unit 21K, . . . , and an $N2^{th}$ preset data transmission unit 21N2, where $1 \leq K \leq N2$. Each bit of data Bit<0:7> of the initial data Data1 is transmitted to the internal data transmission module 30 via corresponding N3 preset data transmission units, and transmitted to the memory array 300 via the internal data transmission module 30. To be specific, the number of preset data transmission units for transmitting Bit<0>, the number of preset data transmission units for transmitting Bit<1>, the number of preset data transmission units for transmitting Bit<2>, the number of preset data transmission units for transmitting Bit<3>, the number of preset data transmission units for transmitting Bit<4>, the number of preset data transmission units for transmitting Bit<5>, the number of preset data transmission units for transmitting Bit<6>, and the number of preset data transmission units for transmitting Bit<7> are all N3. N3=N2/N1, and K, N1, N2 and N3 are all positive integers. In the embodiments, the initial data is written into the reserved mode register in the mode register 200, and each bit of data of the initial data is transmitted to the internal data transmission module 30 via the preset data transmission units, and to the memory array 300 via the internal data transmission module 30. An encoding relationship among the N3 preset data transmission units corresponding to each bit of data of the initial data may be set based on the content of the target data, thereby effectively reducing the complexity of setting the encoding rule and reducing the complexity of writing the target data into the memory array based on the initial data Data1.

In some exemplary embodiments, still referring to FIG. 6A and FIG. 6B, the internal data transmission module includes a total of N2 internal data transmission units: a $1^{st}$ internal data transmission unit, . . . , an $m^{th}$ internal data transmission unit, . . . , and an $N2^{th}$ internal data transmission unit, where N3=N2/N1 and $1 \leq m \leq N2$. The first data transmission module includes a first data transmission unit 221, . . . , a first data transmission unit 22j, . . . , and a first data transmission unit 22N2, where $1 \leq j \leq N2$. The second data transmission module includes a second data transmission unit 231, . . . , a second data transmission unit 23i, . . . , and a second data transmission unit 23N2, where $1 \leq i \leq N2$, and m, i, j, N1, N2, and N3 are all positive integers. Output terminals of the $K^{th}$ preset data transmission unit 21K, the first data transmission unit 22j and the second data transmission unit 23i are all connected to an input terminal of the corresponding $m^{th}$ internal data transmission unit. In the embodiments, an encoding relationship among the N3 preset data transmission units corresponding to each bit of data of the initial data may be set based on the content of the target data, thereby effectively reducing the complexity of setting the encoding rule and reducing the complexity of writing the target data into the memory array 300 based on the initial data Data1.

In some exemplary embodiments, referring to FIG. 6A and FIG. 6B, the $m^{th}$ internal data transmission unit may include one or more of a driver unit, a buffer, a read-write conversion unit, and the like. The type and number of electrical components included in the $m^{th}$ internal data transmission unit can be determined based on functional components in the actual circuit of the specific application scenario. A person skilled in the art can determine without doubt that equivalent variations made under the conception of the present disclosure fall within the protection scope of the embodiments of the present disclosure.

In some exemplary embodiments, still referring to FIG. 6A and FIG. 6B, the number of preset data transmission units corresponding to at least two bits of data of the initial data is different, to increase the richness of the encoding rules.

Figure 7A:
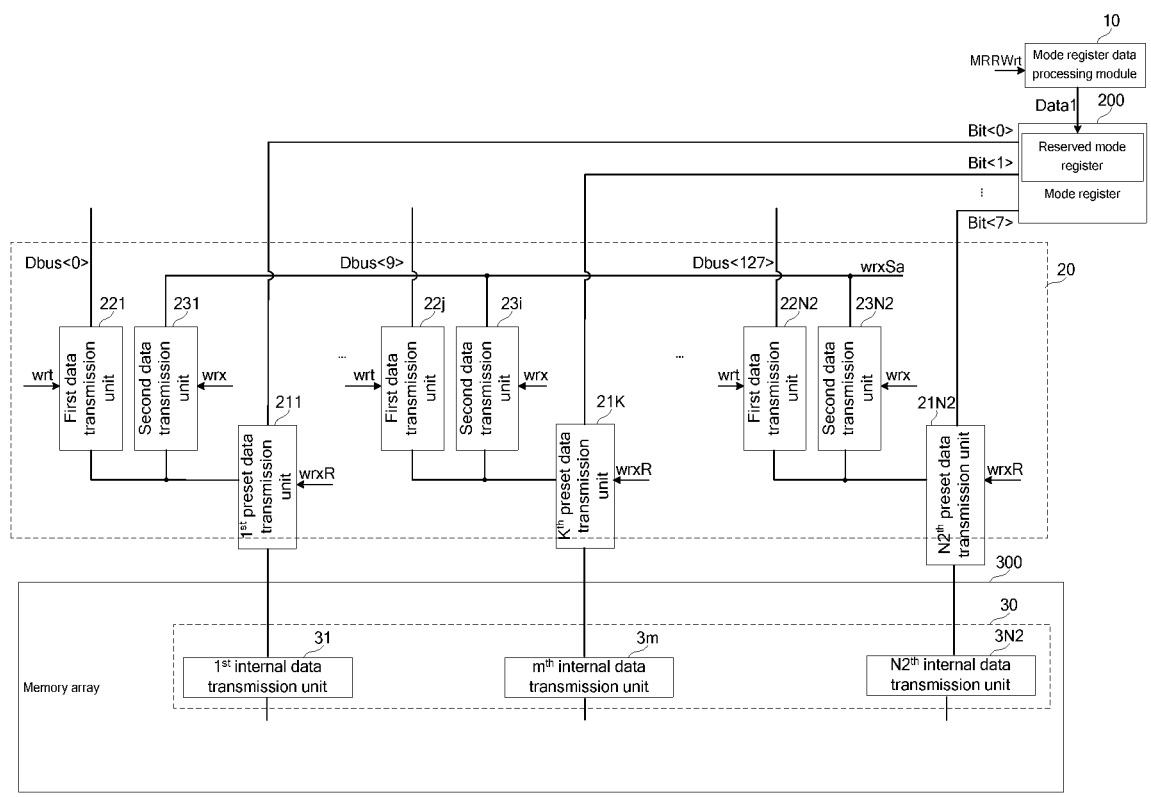
FIG. 7A is a first schematic circuit principle diagram of the embodiment in FIG. 3.
Figure 7B:
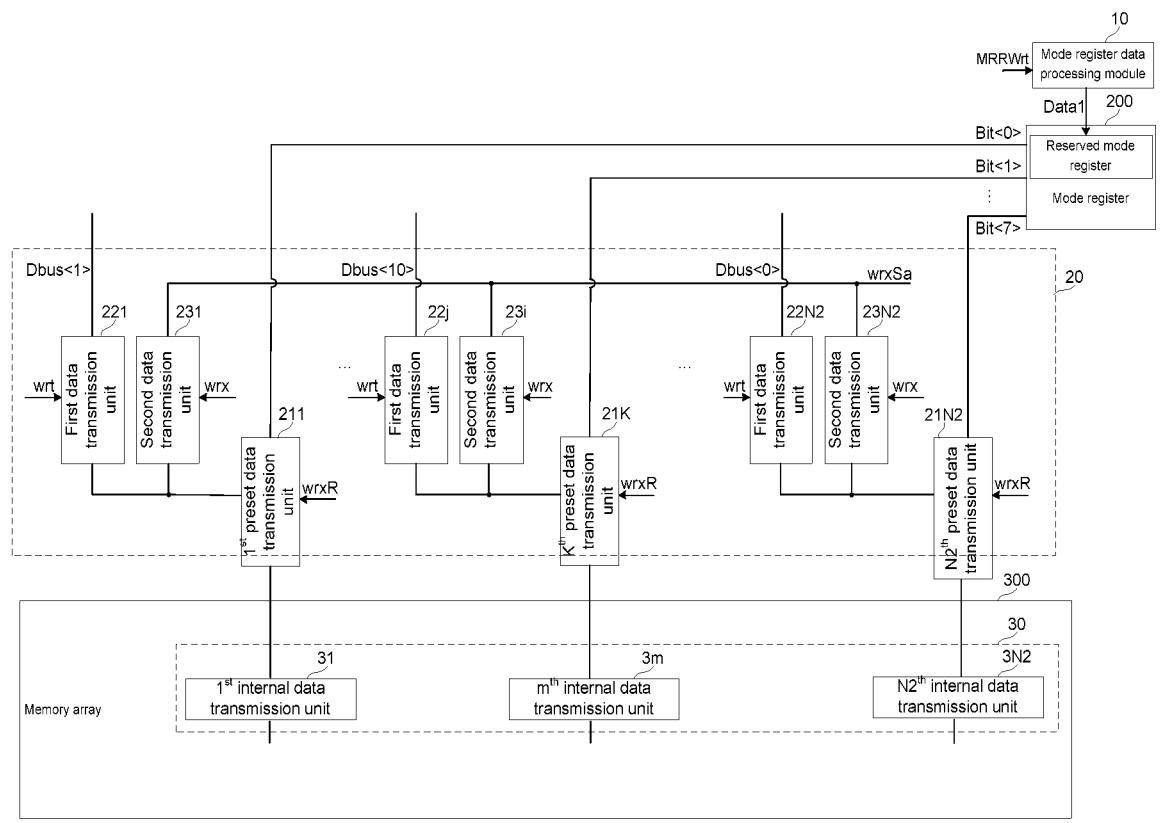
FIG. 7B is a second schematic circuit principle diagram of the embodiment in FIG. 3.

In some exemplary embodiments, referring to FIG. 7A and FIG. 7B, the output terminals of the first data transmission unit 22j and the second data transmission unit 23i are electrically connected to the input terminal of the $m^{th}$ internal data transmission unit via the corresponding $K^{th}$ preset data transmission unit 21 K, where $1 \leq K \leq N2$, $1 \leq m \leq N2$, $1 \leq i \leq N2$, $1 \leq i \leq N2$, and m, i, j, K, N1, N2 and N3 are all positive integers. In the embodiments, the initial data is written into the reserved mode register in the mode register 200, and each bit of data of the initial data is transmitted to the internal data transmission module 30 via the preset data transmission units, and to the memory array 300 via the internal data transmission module 30. An encoding relationship among the N3 preset data transmission units corresponding to each bit of data of the initial data may be set based on the content of the target data, thereby effectively reducing the complexity of setting the encoding rule and reducing the complexity of writing the target data into the memory array based on the initial data Data1.

Figure 8A:
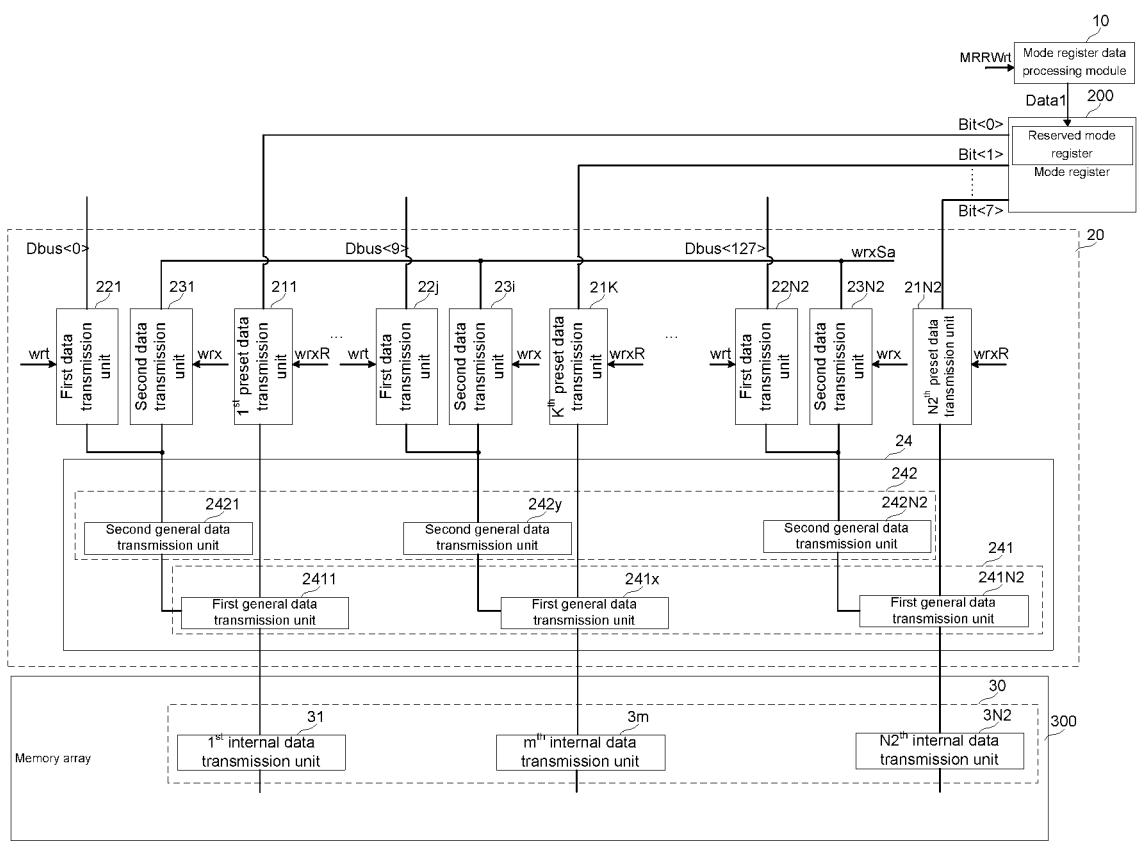
FIG. 8A is a first schematic circuit principle diagram of the embodiment in FIG. 5.
Figure 8B:
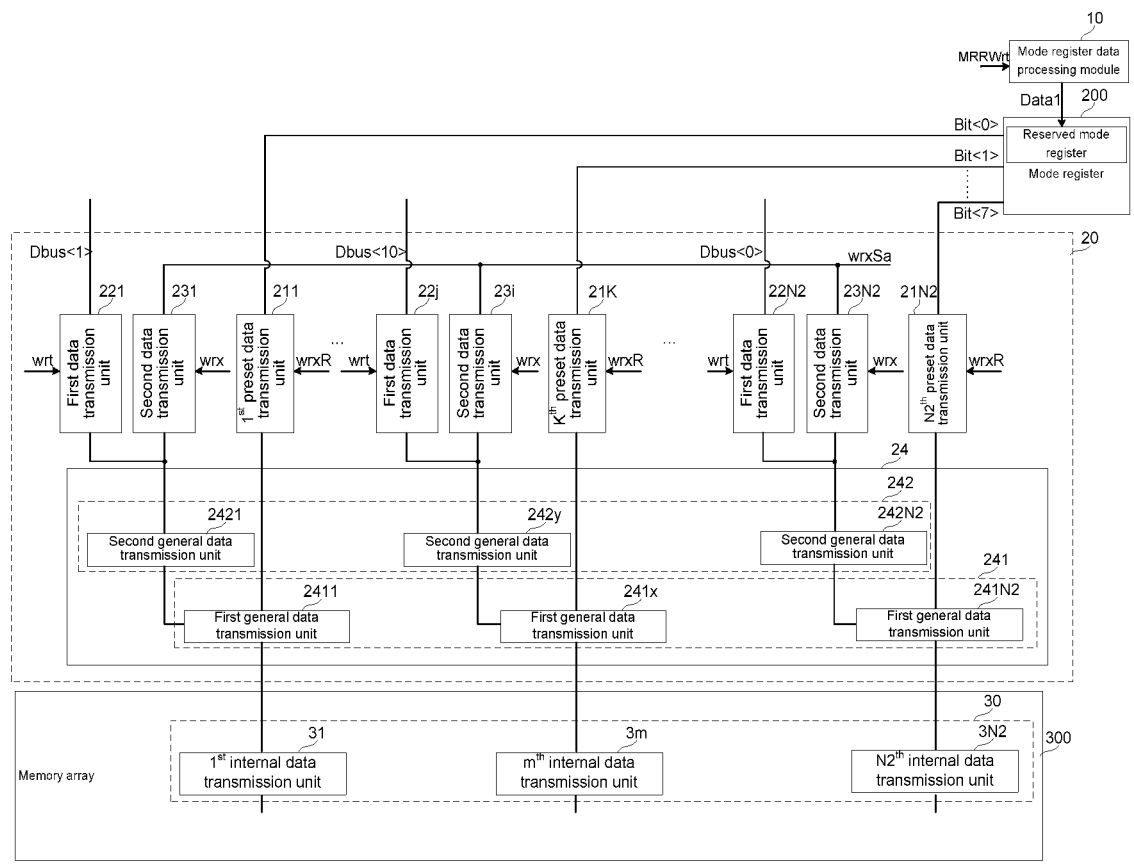
FIG. 8B is a second schematic circuit principle diagram of the embodiment in FIG. 5.

In some exemplary embodiments, referring to FIG. 8A and FIG. 8B, the first general data transmission module 241 includes a first general data transmission unit 2411, . . . , a first general data transmission unit 241x, . . . , and a first general data transmission unit 241N2, where $1 \leq x \leq N2$, the second general data transmission module 242 includes a second general data transmission unit 2421, . . . , a second general data transmission unit 242y, . . . , and a second general data transmission unit 242N2, where $1 \leq y \leq N2$; output terminals of the first data transmission unit 22j and the second data transmission unit 23i are electrically connected to an input terminal of the first general data transmission unit 241x via the second general data transmission unit 242y; and the $K^{th}$ preset data transmission unit 21K is electrically connected to an input terminal of the $m^{th}$ internal data transmission unit via the first general data transmission unit 241x, where $1 \leq K \leq N2$, $1 \leq m \leq N2$, $1 \leq i \leq N2$, $1 \leq j \leq N2$, $1 \leq x \leq N2$, $1 \leq y \leq N2$, m, i, j, K, x, y, N1, N2 and N3 are all positive integers. In the embodiments, the initial data is written into the reserved mode register in the mode register 200, and each bit of data of the initial data is transmitted to the internal data transmission module 30 via the preset data transmission units, and to the memory array 300 via the internal data transmission module 30. An encoding relationship among the N3 preset data transmission units corresponding to each bit of data of the initial data may be set based on the content of the target data, thereby effectively reducing the complexity of setting the encoding rule and reducing the complexity of writing the target data into the memory array based on the initial data Data1.

In some exemplary embodiments, referring to FIG. 8A and FIG. 8B, the first general data transmission unit 241x may include one or more of a driver unit, a buffer, a read-write conversion unit, and the like. The type and number of electrical components included in the first general data transmission unit 241x can be determined based on functional components in the actual circuit of the specific application scenario. A person skilled in the art can determine without doubt that equivalent variations made under the conception of the present disclosure fall within the protection scope of the embodiments of the present disclosure.

In some exemplary embodiments, referring to FIG. 8A and FIG. 8B, the second general data transmission unit 242y may include one or more of a driver unit, a buffer, a read-write conversion unit, and the like. The type and number of electrical components included in the first general data transmission unit 241x can be determined based on functional components in the actual circuit of the specific application scenario. A person skilled in the art can determine without doubt that equivalent variations made under the conception of the present disclosure fall within the protection scope of the embodiments of the present disclosure.

In some exemplary embodiments, referring to FIG. 8A and FIG. 8B, the first general data transmission module and the second general data transmission module are located in the memory array. In other embodiments of the present disclosure, the first general data transmission module or the second general data transmission module is located outside the memory array. The embodiments achieve writing arbitrary target data into the memory array with the help of existing functional components in the specific used circuit, reducing the circuit costs while applicable to the practical needs of many different application scenarios.

Figure 9A:
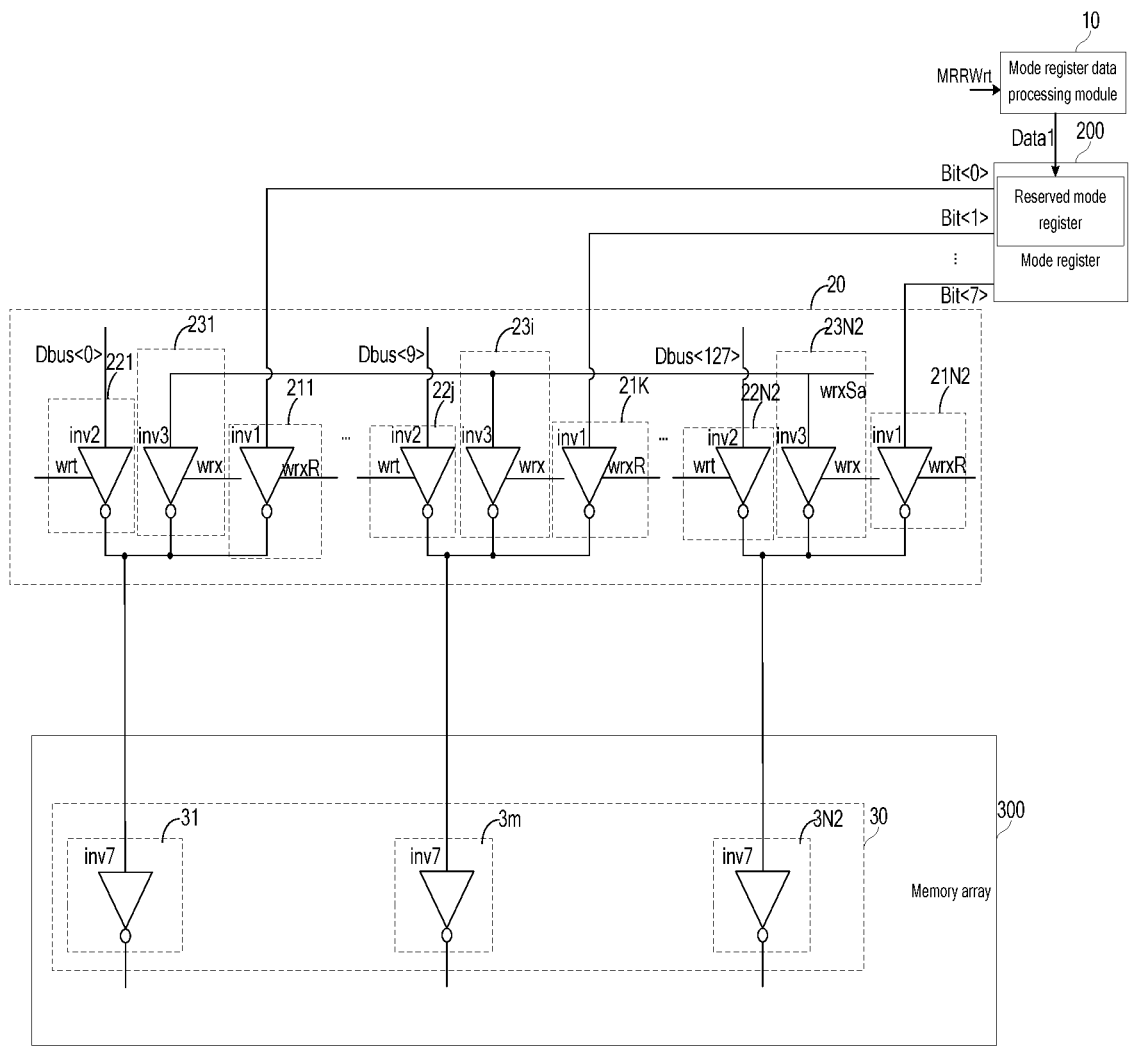
FIG. 9A is a first schematic circuit diagram of the embodiment in FIG. 2.
Figure 9B:
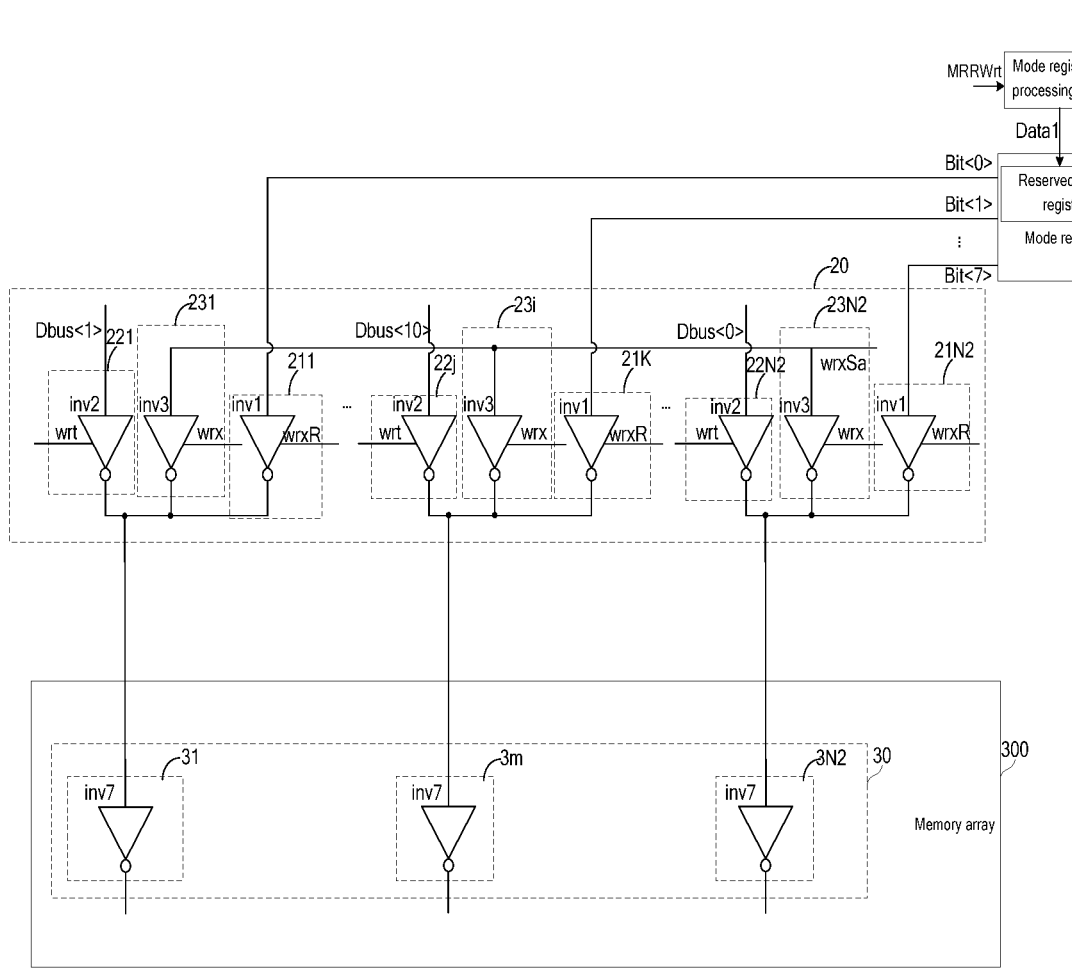
FIG. 9B is a second schematic circuit diagram of the embodiment in FIG. 2.

In some exemplary embodiments, referring to FIG. 9A and FIG. 9B, the enable signal includes a write enable command wrxR, and the preset data transmission unit includes a first gating inverter inv1, where an input terminal of the first gating inverter inv1 is electrically connected to the reserved mode register, an output terminal of the first gating inverter inv1 is electrically connected to the input terminal of the internal data transmission module 30, and a control terminal of the first gating inverter inv1 is configured to receive the write enable command wrxR and write, in response to the write enable command wrxR, the target data into the memory array 300 via the internal data transmission module according to the received initial data and the preset encoding rule. The embodiments reduce the complexity of writing the target data into the memory array 300 based on the initial data.

In some exemplary embodiments, still referring to FIG. 9A and FIG. 9B, the first data transmission unit includes a second gating inverter inv2, where an input terminal of the second gating inverter inv2 is electrically connected to the corresponding data bus, an output terminal of the second gating inverter inv2 is electrically connected to the internal data transmission module 30, and a control terminal of the second gating inverter inv2 is configured to receive the write enable signal wrt and provide, in response to the write enable signal wrt, the corresponding data to the internal data transmission module 30 based on the data provided by the corresponding data bus. The second data transmission unit includes a third gating inverter inv3, where an input terminal of the third gating inverter inv3 is electrically connected to the corresponding low-power-consumption data line wrxSa, an output terminal of the third gating inverter inv3 is electrically connected to the internal data transmission module 30, and a control terminal of the third gating inverter is configured to receive the low-power-consumption write enable signal wrx and provide, in response to the low-power-consumption write enable signal wrx, the corresponding data to the internal data transmission module 30 based on the data provided by the corresponding low-power-consumption data line wrxSa. When the low-power-consumption write enable signal wrx is at a high level, the third gating inverter inv3 provides the corresponding data to the internal data transmission module 30 based on the data provided by the corresponding low-power-consumption data line wrxSa, and the data is transmitted to the memory array 300 via the internal data transmission module 30. When the low-power-consumption write enable signal wrx is at a low level, the third gating inverter inv3 is in a high resistance state. The embodiments achieve low-power-consumption data transmission, and improve the energy efficiency of the circuit while reducing structure complexity. The low-power-consumption data line WrxSa may be electrically connected to a data pad of the memory via another functional component, to receive data outside the memory via the data pad, or the low-power-consumption data line WrxSa may be electrically connected to the mode register, to receive data provided by the mode register. In this way, in a specific application scenario, the second data transmission module 23 transmits, in response to the low-power-consumption write enable signal Wrx, the data provided by the low-power-consumption data line WrxSa.

Figure 10A:
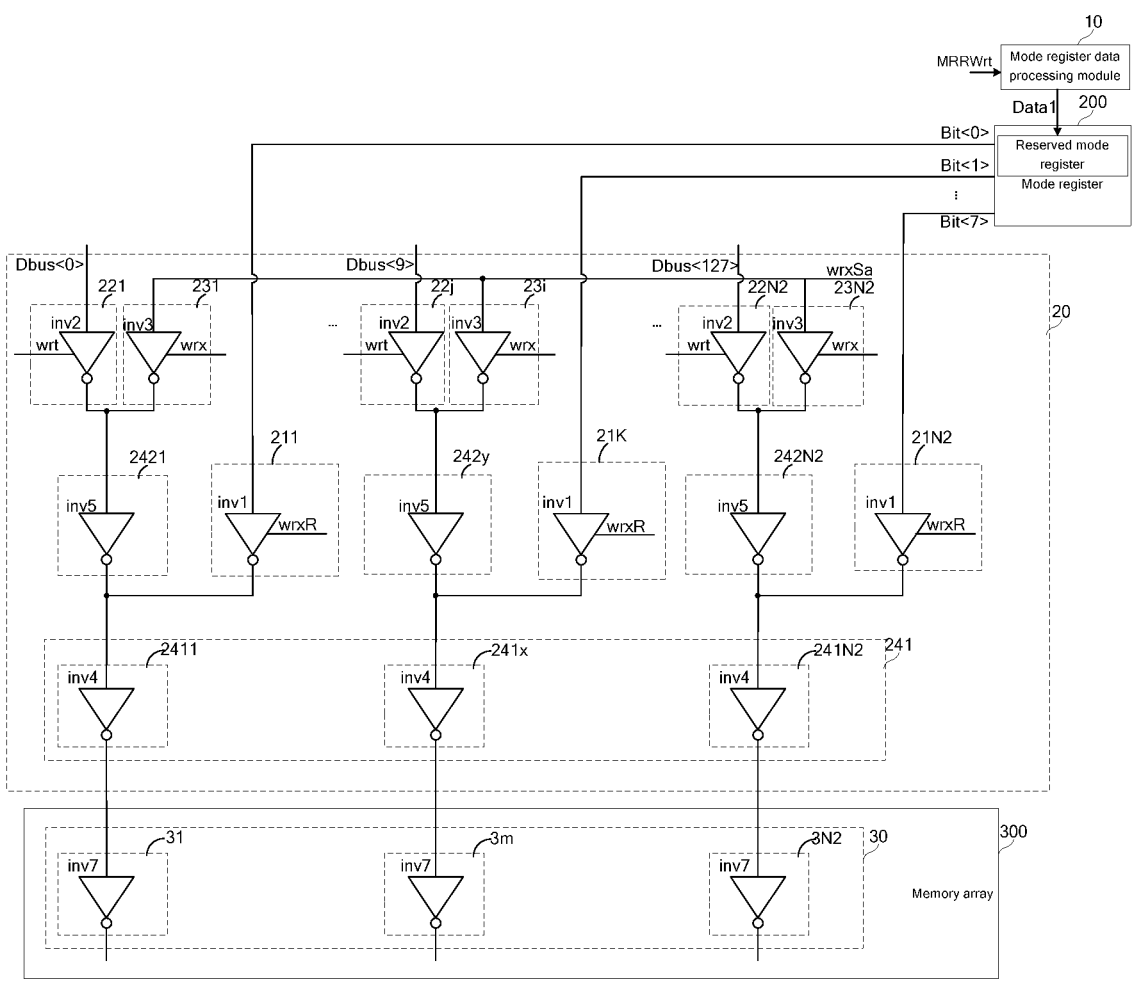
FIG. 10A is a first schematic circuit diagram of the embodiment in FIG. 5.
Figure 10B:
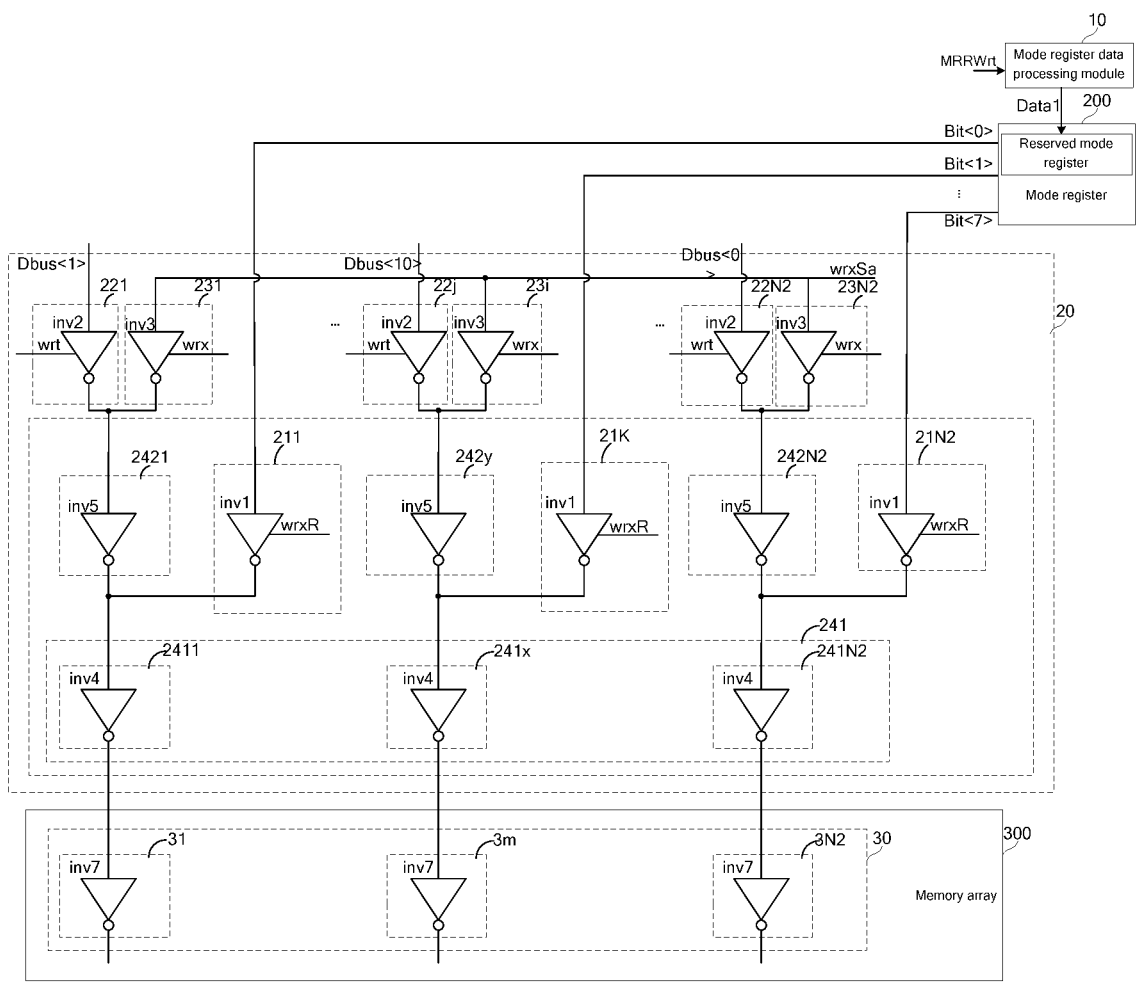
FIG. 10B is a second schematic circuit diagram of the embodiment in FIG. 5.

In some exemplary embodiments, referring to FIG. 10A and FIG. 10B, the first general data transmission module includes a first inverter inv4, and the first gating inverter inv1 is electrically connected to the internal data transmission module 30 via the first inverter inv4; the second general data transmission module includes a second inverter inv5, and output terminals of the second gating inverter inv2 and the third gating inverter inv3 are electrically connected to an input terminal of the first inverter inv4 via the second inverter inv5. The embodiments achieve writing arbitrary target data into the memory array with the help of existing functional components in the specific used circuit, reducing the circuit costs while applicable to the practical needs of many different application scenarios.

Figure 11A:
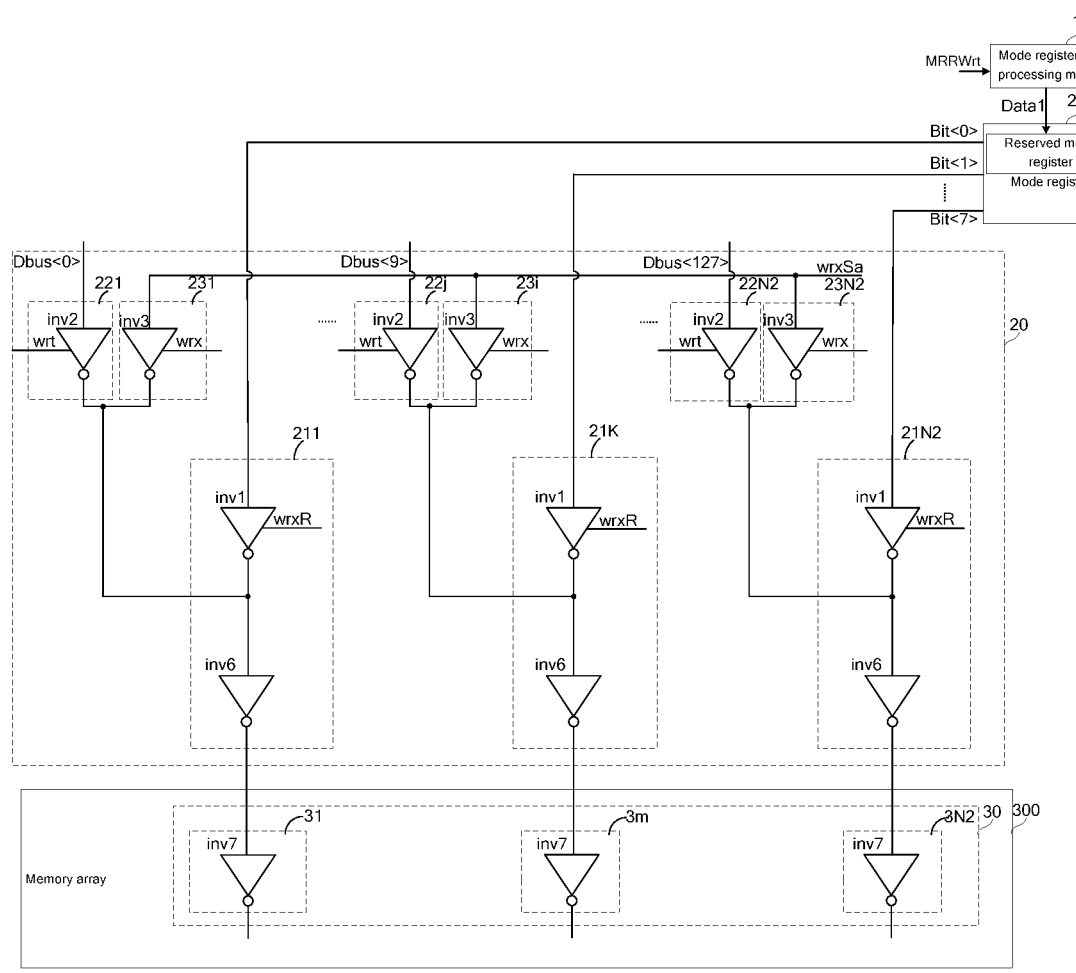
FIG. 11A is a first schematic circuit diagram of the embodiment in FIG. 3.
Figure 11B:
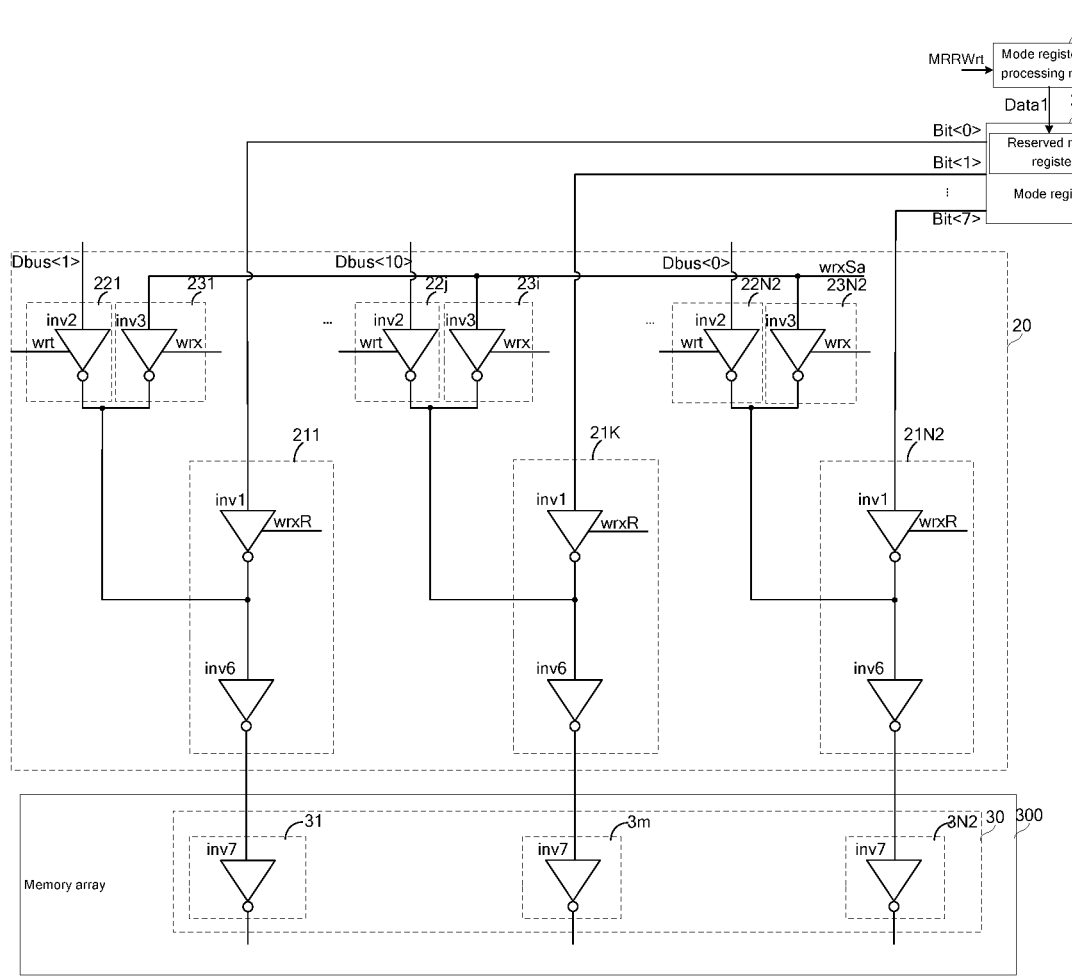
FIG. 11 B is a second schematic circuit diagram of the embodiment in FIG. 3.

In some exemplary embodiments, referring to FIG. 11A and FIG. 11 B, the preset data transmission unit further includes a third inverter inv6, where an input terminal of the third inverter inv6 is electrically connected to the output terminal of the first gating inverter inv1, the an output terminal of the second gating inverter inv2, and the output terminal of the third gating inverter inv3, and an output terminal of the third inverter inv6 is connected to the input terminal of the internal data transmission module 30. The embodiments achieve writing arbitrary target data into the memory array with the help of existing functional components in the specific used circuit, reducing the circuit costs while applicable to the practical needs of many different application scenarios.

In an embodiment of the present disclosure, a storage apparatus including a memory array, a mode register, and the circuit for transmitting data according to any of the embodiments of the present disclosure. Since the target data is written into the memory array by using the reserved mode register in the mode register and the conventional mode register write enable command MRRWrt, and the content of the target data can be changed by setting different encoding rules, such that arbitrary data can be written into the memory array without a data strobe clock signal (WCK) or a data clock signal (DQ) and without increasing structure complexity of the circuit, thus effectively improving the storage performance of the semiconductor storage apparatus. Because of the low-power-consumption write function of the enable signal, this embodiment reduces the data transmission power consumption of the semiconductor storage apparatus while ensuring the storage capacity.

In some exemplary embodiments, the write enable command and the data strobe clock signal (WCK) may be set to be mutually inverted signals, such that the low-power-consumption write function of the write enable command is mutually exclusive during writing data into the memory array using the data strobe clock signal.

Figure 12:
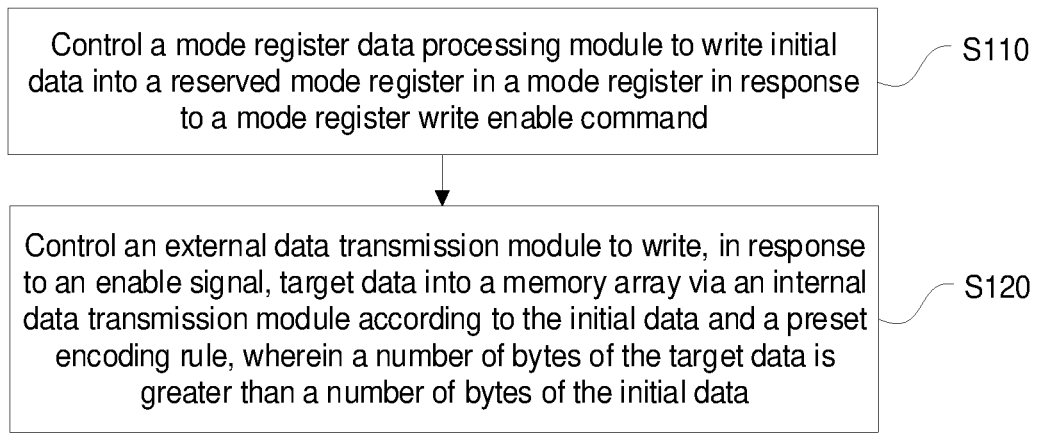
FIG. 12 is a schematic flowchart of a method for transmitting data according to an embodiment of the present disclosure.

Referring to FIG. 12, an embodiment of the present disclosure provides a method for transmitting data, including:

Step S110: Control a mode register data processing module to write initial data into a reserved mode register in a mode register in response to a mode register write enable command.

Step S120: Control an external data transmission module to write, in response to an enable signal, target data into a memory array via an internal data transmission module according to the initial data and a preset encoding rule, where the number of bytes of the target data is greater than the number of bytes of the initial data.

In this embodiment, after the initial data is written into the reserved mode register in the mode register by using the mode register write enable command, the preset encoding rule is changed, and the target data written into the memory array is changed by using the low-power-consumption write function of the enable signal, thereby writing arbitrary data into the memory array without the data strobe clock signal or the data clock signal. In the conventional write function, only all "0" or all "1" can be written into the memory array by using the write enable command. This embodiment effectively improves the storage performance of the semiconductor storage apparatus. With the low-power-consumption write function of the enable signal, this embodiment reduces the data transmission power consumption of the semiconductor storage apparatus while ensuring the storage capacity.

In some exemplary embodiments, the number of bytes of the initial data is N1, the number of bytes of the target data is N2, and the external data transmission module includes N2 preset data transmission units; each bit of data of the initial data is electrically connected to an input terminal of the internal data transmission module via corresponding N3 preset data transmission units; N3=N2/N1, and N1, N2 and N3 are all positive integers, thereby reducing the complexity of writing the target data into the memory array based on the initial data. The data transmitted by the N3 preset data transmission units corresponding to any bit of data of the initial data are equal, to reduce the structure complexity and production costs of the circuit, and improve the operation reliability of the circuit.

In some exemplary embodiments, the number of preset data transmission units corresponding to at least two bits of data of the initial data is different, to increase the richness of the encoding rules and to apply to different application scenarios.

In some exemplary embodiments, still referring to FIG. 2, the enable signal further includes a write enable signal Wrt, the external data transmission module 20 further includes a first data transmission module 22, the first data transmission module 22 includes first data transmission units, and the number of the first data transmission units is equal to the number of bytes, for example, N2, of the target data; an input terminal of the first data transmission unit is electrically connected to a corresponding data bus Dbus, an output terminal of the first data transmission unit is electrically connected to the internal data transmission module 30, and a control terminal of the first data transmission unit is configured to receive the write enable signal Wrt and provide, in response to the write enable signal Wrt, corresponding data to the internal data transmission module 30 based on the data provided by the corresponding data bus Dbus. In the embodiments, the first data transmission module 22 transmits the data provided by the data bus Dbus in response to the write enable signal Wrt, to write data into the memory array with low power consumption, thereby meeting the storage data writing needs of different application scenarios.

In some exemplary embodiments, after step S120, the method further includes:

Step S130: Control a read unit to read storage data from connected storage bits in response to a parameter read command of the mode register.

Step S140: Generate encoded data based on the data provided by each read unit and save the encoded data to a preset location in the mode register.

For example, the number of bytes of the encoded data may be set equal to the number of bytes of the target data, and the encoded data has a preset relationship with the target data. The target data is compared with the encoded data, and whether there is a data transmission abnormality is determined based on the comparison result. For example, the target data may be compared with the encoded data bit by bit; and if each bit of data of the target data equals to each bit of data of the encoded data, it is determined that data transmission is normal; otherwise, it is determined that data transmission is abnormal. In the embodiments, a failed bit in the memory array can be detected timely, which improves the operation reliability of the memory array.

In some exemplary embodiments, when the target data is compared with the encoded data bit by bit, if a bit of the encoded data is not equal to a corresponding bit of the target data, position data of a storage bit corresponding to the bit of the encoded data or the bit of the target data may be obtained, and the storage bit is determined to be a failed bit. In the embodiments, the complexity of obtaining the comparison result is reduced and the accuracy of the obtained comparison result is improved. In addition, the position data of the failed bit in the memory array can be obtained based on the comparison result, thereby improving the operation reliability and intelligence of the memory array.

In the method for transmitting data and the storage apparatus provided in the embodiments, after the initial data is written into the reserved mode register in the mode register by using the mode register write enable command, the preset encoding rule is changed, and the target data written into the memory array is changed by using the low-power-consumption write function of the enable signal, thereby writing arbitrary data into the memory array without the data strobe clock signal or the data clock signal. In the conventional write function, only all "0" or all "1" can be written into the memory array by using the write enable command. The embodiments effectively improve the storage performance of the semiconductor storage apparatus. With the low-power-consumption write function of the enable signal, the embodiments reduce the data transmission power consumption of the semiconductor storage apparatus while ensuring the storage capacity.

For specific limitations of the method for transmitting data in the embodiments of the present disclosure, refer to the specific limitations of the circuit for transmitting data in the foregoing embodiments, and details are not be repeated here.

It should be understood that although the steps in the flowchart of FIG. 12 are sequentially displayed according to the arrows, these steps are not necessarily performed in the order indicated by the arrows. Unless clearly described otherwise, the execution order of the steps is not strictly limited, and these steps may be executed in other orders. Moreover, at least some of the steps in FIG. 12 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

Those of ordinary skill in the art may understand that all or some of the procedures in the methods of the above embodiments may be implemented by a computer program instructing related hardware. The computer program may be stored in a non-volatile computer-readable storage medium. When the computer program is executed, the procedures in the embodiments of the above methods may be performed. Any reference to a memory, a storage, a database, or other media used in the embodiments of the present disclosure may include a non-volatile and/or volatile memory. The nonvolatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache memory. By way of illustration rather than limitation, the RAM may be in various forms, such as a static RAM (SRAM), a dynamic RAM (DRAM), a synchronous DRAM (SDRAM), a double data rate SDRAM (DDRSDRAM), an enhanced SDRAM (ESDRAM), a synchlink DRAM (SLDRAM), a rambus DRAM (RDRAM), and a direct RDRAM (DRDRAM).

It should be noted that the foregoing embodiments are merely for the purpose of description instead of limiting the present disclosure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

In the circuit and the method for transmitting data and the storage apparatus provided in the disclosed embodiments, after the initial data is written into the reserved mode register in the mode register by using the mode register write enable command, the preset encoding rule is changed, and the target data written into the memory array is changed by using the low-power-consumption write function of the enable signal, thereby writing arbitrary data into the memory array without the data strobe clock signal or the data clock signal. In the conventional write function, only all "0" or all "1" can be written into the memory array by using the write enable command. The embodiments of the present disclosure effectively improve the storage performance of the semiconductor storage apparatus. With the low-power-consumption write function of the enable signal, the embodiments of the present disclosure reduce the data transmission power consumption of the semiconductor storage apparatus while ensuring the storage capacity.

What is claimed is:

1. A circuit for transmitting data, comprising a mode register data processing module, an external data transmission module, and an internal data transmission module provided in a memory array, wherein the mode register data processing module receives a mode register write enable command and outputs initial data, wherein the mode register data processing module writes the initial data into a reserved mode register in a mode register in response to the mode register write enable command; and the external data transmission module is electrically connected to both the reserved mode register and the internal data transmission module, and is configured to write, in response to an enable signal, target data into the memory array via the internal data transmission module according to the initial data and a preset encoding rule, wherein a number of bytes of the target data is greater than a number of bytes of the initial data;

wherein the number of bytes of the initial data is N1, the number of bytes of the target data is N2, the external data transmission module comprises a preset data transmission module, and the preset data transmission module comprises the N2 preset data transmission units;

each bit of data of the initial data is electrically connected to an input terminal of the internal data transmission module via corresponding N3 preset data transmission units;

the N3=the N2/the N1; and the N1, the N2 and the N3 are all positive integers.

2. The circuit for transmitting data according to claim 1 wherein the enable signal comprises a write enable command, and each of the preset data transmission units comprises:
a first gating inverter, wherein an input terminal of the first gating inverter is electrically connected to the reserved mode register, an output terminal of the first gating inverter is electrically connected to the input terminal of the internal data transmission module, or is electrically connected to the input terminal of the internal data transmission module via a general data transmission module, and a control terminal of the first gating inverter is configured to receive the write enable command and write, in response to the write enable command, the target data into the memory array via the internal data transmission module according to the initial data received and the preset encoding rule.

3. The circuit for transmitting data according to claim 2, wherein data transmitted by the N3 preset data transmission units corresponding to any bit of data of the initial data are equal.

4. The circuit for transmitting data according to claim 1 wherein a number of preset data transmission units corresponding to at least two bits of data of the initial data is different.

5. The circuit for transmitting data according to claim 2, wherein the enable signal further comprises a write enable signal, the external data transmission module further comprises a first data transmission module comprising first data transmission units, wherein a number of the first data transmission units is equal to the number of bytes of the target data; and
an input terminal of the first data transmission unit is electrically connected to a corresponding data bus, an output terminal of the first data transmission unit is electrically connected to the internal data transmission module, or is electrically connected to the internal data transmission module via the preset data transmission module or the general data transmission module, and a control terminal of the first data transmission unit is configured to receive the write enable signal and provide, in response to the write enable signal, corresponding data to the internal data transmission module based on data provided by the corresponding data bus.

6. The circuit for transmitting data according to claim 5, wherein the first data transmission unit comprises:
a second gating inverter, wherein an input terminal of the second gating inverter is electrically connected to the corresponding data bus, an output terminal of the second gating inverter is electrically connected to the internal data transmission module, or is electrically connected to the internal data transmission module via the preset data transmission module or the general data transmission module, and a control terminal of the second gating inverter is configured to receive the write enable signal and provide, in response to the write enable signal, the corresponding data to the internal data transmission module based on the data provided by the corresponding data bus.

7. The circuit for transmitting data according to claim 6, wherein the enable signal further comprises a low-power-consumption write enable signal, the external data transmission module further comprises a second data transmission module comprising second data transmission units, wherein a number of the second data transmission units is equal to the number of bytes of the target data; and
an input terminal of the second data transmission unit is electrically connected to a corresponding low-power-consumption data line, an output terminal of the second data transmission unit is electrically connected to the internal data transmission module, or is electrically connected to the internal data transmission module via the preset data transmission module or the general data transmission module, and a control terminal of the second data transmission unit is configured to receive the low-power-consumption write enable signal and provide, in response to the low-power-consumption write enable signal, corresponding data to the internal data transmission module based on data provided by the corresponding low-power-consumption data line.

8. The circuit for transmitting data according to claim 7, wherein the second data transmission unit comprises:
a third gating inverter, wherein an input terminal of the third gating inverter is electrically connected to the corresponding low-power-consumption data line, an output terminal of the third gating inverter is electrically connected to the internal data transmission module, or is electrically connected to the internal data transmission module via the preset data transmission module or the general data transmission module, and a control terminal of the third gating inverter is configured to receive the low-power-consumption write enable signal and provide, in response to the low-power-consumption write enable signal, the corresponding data to the internal data transmission module based on the data provided by the corresponding low-power-consumption data line.

9. The circuit for transmitting data according to claim 8, wherein the general data transmission module comprises:
a first general data transmission module, wherein a first input terminal of the first general data transmission module is connected to an output terminal of the preset data transmission module, and an output terminal of the first general data transmission module is connected to the input terminal of the internal data transmission module; and
a second general data transmission module, wherein a first input terminal of the second general data transmission module is connected to an output terminal of the first data transmission module, a second input terminal of the second general data transmission module is connected to an output terminal of the second data transmission module, and an output terminal of the second general data transmission module is connected to a second input terminal of the first general data transmission module.

10. The circuit for transmitting data according to claim 9, wherein the first general data transmission module comprises a first inverter, and the preset data transmission module is electrically connected to the internal data transmission module via the first inverter; and/or
the second general data transmission module comprises a second inverter, and the first data transmission module is electrically connected to an input terminal of the first inverter via the second inverter.

11. The circuit for transmitting data according to claim 10, wherein the preset data transmission unit further comprises:
a third inverter, wherein an input terminal of the third inverter is connected to the output terminal of the first gating inverter, the output terminal of the first data transmission unit and the output terminal of the second data transmission unit, and an output terminal of the third inverter is connected to the input terminal of the internal data transmission module.

12. The circuit for transmitting data according to claim 9, wherein the first general data transmission module and/or the second general data transmission module are located in the memory array.

13. The circuit for transmitting data according to claim 11, wherein the internal data transmission module comprises internal data transmission units, and a number of the internal data transmission units is equal to the number of bytes of the target data; and the internal data transmission unit comprises:
a fourth inverter, wherein an input terminal of the fourth inverter is connected to the output terminal of the first gating inverter, the output terminal of the second gating inverter and the output terminal of the third gating inverter, or is connected to an output terminal of the first inverter, or is connected to the output terminal of the third inverter, and an output terminal of the fourth inverter is connected to the memory array.

14. A storage apparatus, comprising:
a memory array;
a mode register; and
the circuit for transmitting data according to claim 1.

15. A method for transmitting data, comprising:
controlling a mode register data processing module to receive a mode register write enable command and output initial data, wherein the mode register data processing module writes the initial data into a reserved mode register in a mode register in response to the mode register write enable command; and controlling an external data transmission module to write, in response to an enable signal, target data into a memory array via an internal data transmission module according to the initial data and a preset encoding rule, wherein a number of bytes of the target data is greater than a number of bytes of the initial data;

wherein the number of bytes of the initial data is N1, the number of bytes of the target data is N2, and the external data transmission module comprises the N2 preset data transmission units;

each bit of data of the initial data is electrically connected to an input terminal of the internal data transmission module via corresponding N3 preset data transmission units;

the N3=the N2/the N1; and the N1, the N2 and the N3 are all positive integers.

16. The method according to claim 15 wherein a number of preset data transmission units corresponding to at least two bits of data of the initial data is different.

* * * * *